United States Patent
Park et al.

(10) Patent No.: US 8,547,719 B2
(45) Date of Patent: Oct. 1, 2013

(54) STACKED MEMORY DEVICE AND METHOD THEREOF

(75) Inventors: Jae-chul Park, Seoul (KR); Kee-won Kwon, Suwon-si (KR); I-hun Song, Seongnam-si (KR); Young-soo Park, Yongin-si (KR); Chang-jung Kim, Yongin-si (KR); Sang-wook Kim, Yongin-si (KR); Sun-il Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 328 days.

(21) Appl. No.: 12/588,275

(22) Filed: Oct. 9, 2009

(65) Prior Publication Data

US 2010/0091541 A1  Apr. 15, 2010

(30) Foreign Application Priority Data

Oct. 10, 2008 (KR) .................. 10-2008-0099778

(51) Int. Cl.
*G11C 5/02* (2006.01)

(52) U.S. Cl.
USPC ............. 365/51; 365/63; 365/72; 365/230.06

(58) Field of Classification Search
USPC ................. 365/51, 72, 63, 230.06
See application file for complete search history.

(56) References Cited

U.S. PATENT DOCUMENTS

| | | | |
|---|---|---|---|
| 5,991,186 A | 11/1999 | Balistreri et al. | |
| 6,256,254 B1 | 7/2001 | Kwak et al. | |
| 7,123,497 B2 * | 10/2006 | Matsui et al. | 365/51 |
| 7,327,600 B2 * | 2/2008 | Norman | 365/158 |
| 7,554,873 B2 * | 6/2009 | Lee et al. | 365/230.03 |
| 7,898,893 B2 * | 3/2011 | Park et al. | 365/230.03 |
| 8,054,665 B2 * | 11/2011 | Ahn et al. | 365/51 |
| 2003/0202404 A1 | 10/2003 | Scheuerlein | |
| 2006/0062072 A1 | 3/2006 | Cho | |
| 2006/0164882 A1 | 7/2006 | Norman | |
| 2006/0233082 A1 | 10/2006 | Lee et al. | |

(Continued)

FOREIGN PATENT DOCUMENTS

| EP | 1 308 958 | 5/2003 |
|---|---|---|
| EP | 2 037 461 | 3/2009 |

(Continued)

OTHER PUBLICATIONS

An English language abstract of Korean Publication No. KR 10-2004-0015901, published Feb. 21, 2004.

(Continued)

*Primary Examiner* — Alexander Sofocleous
*Assistant Examiner* — Lance Reidlinger
(74) *Attorney, Agent, or Firm* — Harness, Dickey & Pierce, P.L.C.

(57) ABSTRACT

A stacked memory device includes a plurality of memory layers, where at least one of the plurality of memory layers is stacked on another of the plurality of memory layers and each of the memory layers includes an array of memory cells, a first active circuit unit configured to classify and process address information for at least one of the memory cells as vertical address information and horizontal address information, and at least one second active circuit unit configured to generate a memory selection signal for at least one of the memory cells based on signals processed by the first active circuit unit.

23 Claims, 14 Drawing Sheets

(56) References Cited

U.S. PATENT DOCUMENTS

| | | |
|---|---|---|
| 2006/0262587 A1 | 11/2006 | Matsui et al. |
| 2007/0063211 A1 | 3/2007 | Iwasaki |
| 2010/0096628 A1* | 4/2010 | Song et al. .................. 257/43 |

FOREIGN PATENT DOCUMENTS

| | | |
|---|---|---|
| EP | 2 061 086 A2 | 5/2009 |
| JP | 2000-113672 | 4/2000 |
| JP | 2000-268561 | 9/2000 |
| JP | 2003-37170 | 2/2003 |
| JP | 2003209222 A | 7/2003 |
| JP | 2004327474 A | 11/2004 |
| JP | 2007536680 A | 12/2007 |
| KR | 10-1999-0034768 | 5/1999 |
| KR | 10-2002-0089588 | 11/2002 |
| KR | 10-2003-0001121 | 1/2003 |
| KR | 10-0481857 | 3/2005 |
| WO | WO 2005/074038 A1 | 8/2005 |

OTHER PUBLICATIONS

European Search Report dated Oct. 6, 2009 for EP Application No. 09165080.4—1528.

Extended European Search Report dated Feb. 15, 2010.

Mark Johnson, et al., "*512-Mb PROM With a Three-Dimensional Array of Diode/Antzfuse Memory Cells*," IEEE Journal of Solid-State Circuits, vol. 38, No. 11, Nov. 2003.

European Search Report dated Mar. 14, 2012, for 11162613.1-1233/2357653.

First Japanese Office Action for corresponding Japanese Application No. 2009-235198 dated Apr. 23, 2013.

\* cited by examiner

STACKED MEMORY DEVICE AND METHOD THEREOF

CROSS-REFERENCE TO RELATED APPLICATIONS

This application claims the benefit of Korean Patent Application No. 10-2008-0099778, filed on Oct. 10, 2008 in the Korean Intellectual Property Office, the disclosure of which is incorporated herein in its entirety by reference.

BACKGROUND

1. Field

One or more example embodiments relate to a semiconductor device, for example, to a multi-layered stacked memory device.

2. Description of the Related Art

Semiconductor products generally require compact sizes and high data processing capabilities. Thus, the operating speed and the integration degree of non-volatile memory devices used in the semiconductor products may need to be increased. In this regard, a multi-layered memory device including memory layers that are three dimensionally stacked has been considered.

However, since arranging circuits to support an operation of a multi-layered memory device may prove difficult, there may be a limit in increasing integration density.

SUMMARY

Additional aspects will be set forth in part in the description which follows and, in part, will be apparent from the description, or may be learned by practice of one or example embodiments of the invention.

According to an example embodiment, a stacked memory device includes a plurality of memory layers, where at least one of the plurality of memory layers is stacked on another of the plurality of memory layers and each of the memory layers includes an array of memory cells, a first active circuit unit configured to classify and process address information for at least one of the memory cells as vertical address information and horizontal address information, and at least one second active circuit unit configured to generate a memory selection signal for at least one of the memory cells based on signals processed by the first active circuit unit.

In an example embodiment, the first active circuit unit includes a level decoder configured to decode the vertical address information, and a pre-decoder configured to decode the horizontal address information.

In an example embodiment, the pre-decoder includes a first pre-decoder, and a second pre-decoder.

In an example embodiment, the at least one second active circuit unit includes a plurality of main decoders interposed between groups of the plurality of memory layers, in order to classify and manage the plurality of memory layers according to the groups.

In an example embodiment, the first active circuit unit includes a level decoder generating a level selection signal, and a pre-decoder generating a row/column signal.

In an example embodiment, the level selection signal is generated by decoding the vertical address information, and the row/column signal is generated by decoding the horizontal address information.

In an example embodiment, the level selection signal includes a decoder selection signal for selective access to at least one of the plurality of main decoders, and a layer selection signal for selective access to at least one of the memory layers managed by at least one of the plurality of main decoders.

In an example embodiment, the at least one second active circuit unit includes a plurality of main decoders disposed at a same level with the plurality of memory layers.

In an example embodiment, the at least one second active circuit unit includes a main decoder decoding signals processed by the first active circuit unit.

In an example embodiment, the main decoder includes a row decoder and a column decoder.

In an example embodiment, the at least one second active circuit unit further includes a sense amplifier configured to amplify information read from the memory cell array.

In an example embodiment, the at least one second active circuit unit further includes a driver configured to buffer a signal generated by the first active circuit unit and received by the main decoder.

In an example embodiment, the main decoder includes a plurality of transistors, where each of the transistors is of a same type.

In an example embodiment, the vertical address information processed by the first active circuit unit is input to gates of the plurality of transistors, and the horizontal address information processed by the first active circuit unit is input to drains of the plurality of transistors.

In an example embodiment, the first active circuit unit further includes an input/output circuit configured to process a data signal of the plurality of memory layers, where the input/output circuit is shared by the plurality of the memory layers.

In an example embodiment, the first active circuit unit further includes an input/output circuit configured to process a data signal of the plurality of memory layers, where the input/output circuit is shared by the at least one second active circuit unit.

In an example embodiment, the memory cell includes a resistive random access memory (RRAM) device.

According to an example embodiment, a stacked memory device includes a plurality of memory layers, where at least one of the plurality of memory layers is stacked on another of the plurality of memory layers and each of the memory layers includes an array of memory cells, a first active circuit unit including a level decoder and a pre-decoder, where the level decoder is configured to decode vertical address information of at least one of the memory cells to generate a level selection signal, and the pre-decoder is configured to decode horizontal address information of at least one of the memory cells to generate a row/column signal, and a plurality of second active circuit units stacked on the first active circuit unit in order to classify and manage the plurality of memory layers according to a plurality of groups of memory layers, wherein each of the second active circuit units includes a main decoder configured to decode the level selection signal and the row/column selection signal to generate a memory selection signal.

In an example embodiment, each of the plurality of second active circuit units are interposed between a group of the memory layers.

According to an example embodiment, a method of accessing a stacked memory device includes providing a plurality of memory layers, where at least one of the plurality of memory layers is stacked on another of the plurality of memory layers and each of the memory layers includes an array of memory cells, classifying and processing address information at a first active circuit unit for at least one of the memory cells as vertical address information and horizontal address information, and generating a memory selection signal from at least one second active circuit unit for at least one of the memory cells based on signals processed by the classifying and processing.

In an example embodiment, the method further includes generating a level selection signal and a row/column signal at the first active circuit, where the level selection signal is generated by decoding the vertical address information, and the row/column signal is generated by decoding the horizontal address information.

In an example embodiment, the method further includes buffering a signal generated by the first active circuit unit and received by the at least one second active circuit.

BRIEF DESCRIPTION OF THE DRAWINGS

These and/or other aspects will become apparent and more readily appreciated from the following description of the example embodiments, taken in conjunction with the accompanying drawings of which.

DETAILED DESCRIPTION

Figure 1:
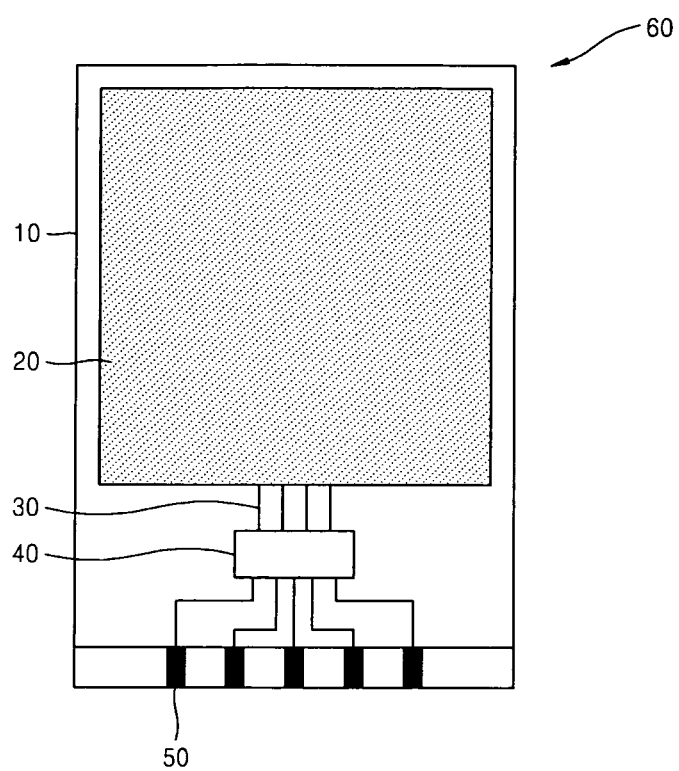
FIG. 1 is a plan view of a memory device according to an example embodiment.

Example embodiments will now be described more fully with reference to the accompanying drawings. Example embodiments of the present invention may, however, be embodied in many different forms and should not be construed as being limited to the example embodiments set forth herein; rather, these example embodiments are provided so that this disclosure will be thorough and complete, and will fully convey the inventive concept to one of ordinary skill in the art. In the drawings, the sizes of elements and the thicknesses of layers and regions may be exaggerated for clarity. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures. The figures are intended to depict example embodiments and should not be interpreted to limit the intended scope of the claims. The accompanying figures are not to be considered as drawn to scale unless explicitly noted.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising," "includes," and/or "including", when used herein, specify the presence of stated features, integers, steps, operations, elements, and/or components, but do not preclude the presence or addition of one or more other features, integers, steps, operations, elements, components, and/or groups thereof. In this specification, the term "and/or" picks out each individual item as well as all combinations of them.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Now, in order to more specifically describe example embodiments, example embodiments will be described in detail with reference to the attached drawings. However, example embodiments are not limited to the embodiments described herein, but may be embodied in various forms. In the figures, if a layer is formed on another layer or a substrate, it means that the layer is directly formed on another layer or a substrate, or that a third layer is interposed there between.

When it is determined that a detailed description related to a related known function or configuration may make the purpose of example embodiments unnecessarily ambiguous, the detailed description thereof will be omitted. Also, terms used herein are defined to appropriately describe example embodiments and thus may be changed depending on a user, the intent of an operator, or a custom. Accordingly, the terms must be defined based on the following overall description within this specification.

FIG. 1 is a plan view of a memory device 60 according to an example embodiment.

Referring to FIG. 1, a memory unit 20 and an I/O chip 40 may be disposed on a substrate 10. The memory unit 20 may be connected to the I/O chip 40 via a parallel bus line 30, and the I/O chip 40 may be connected to a master 50 via a serial bus line. The substrate 10 may be a silicon substrate, or alternatively, a non-silicon substrate, for example, a plastic, glass, ceramic or non-metallic substrate.

Figure 2:
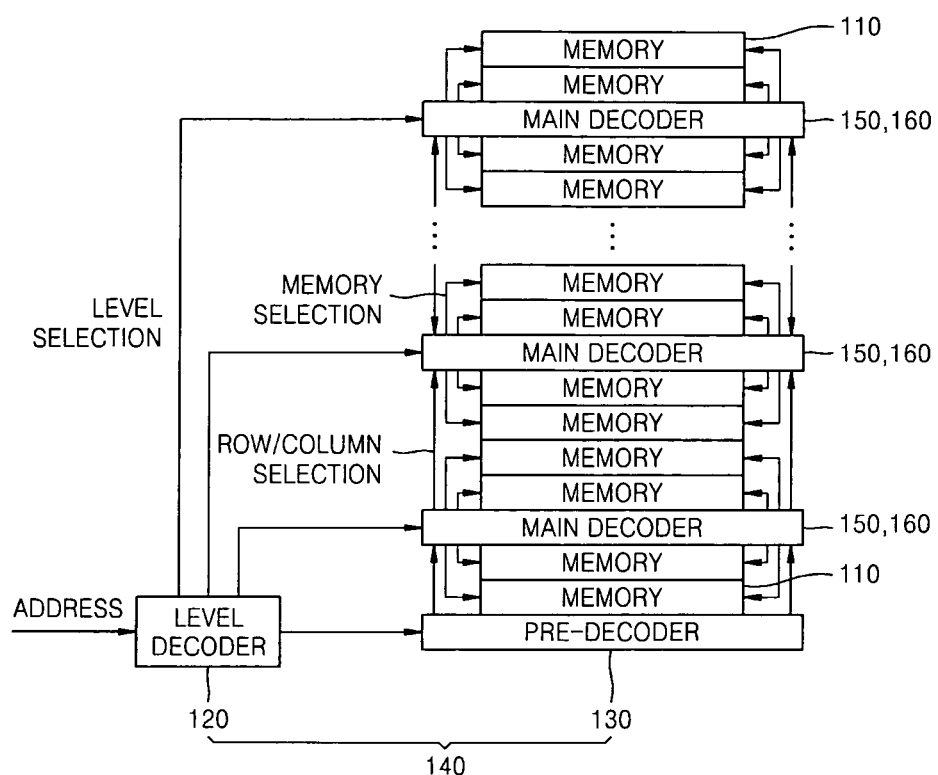
FIG. 2 is a schematic view of a stacked memory device according to an example embodiment.
Figure 3:
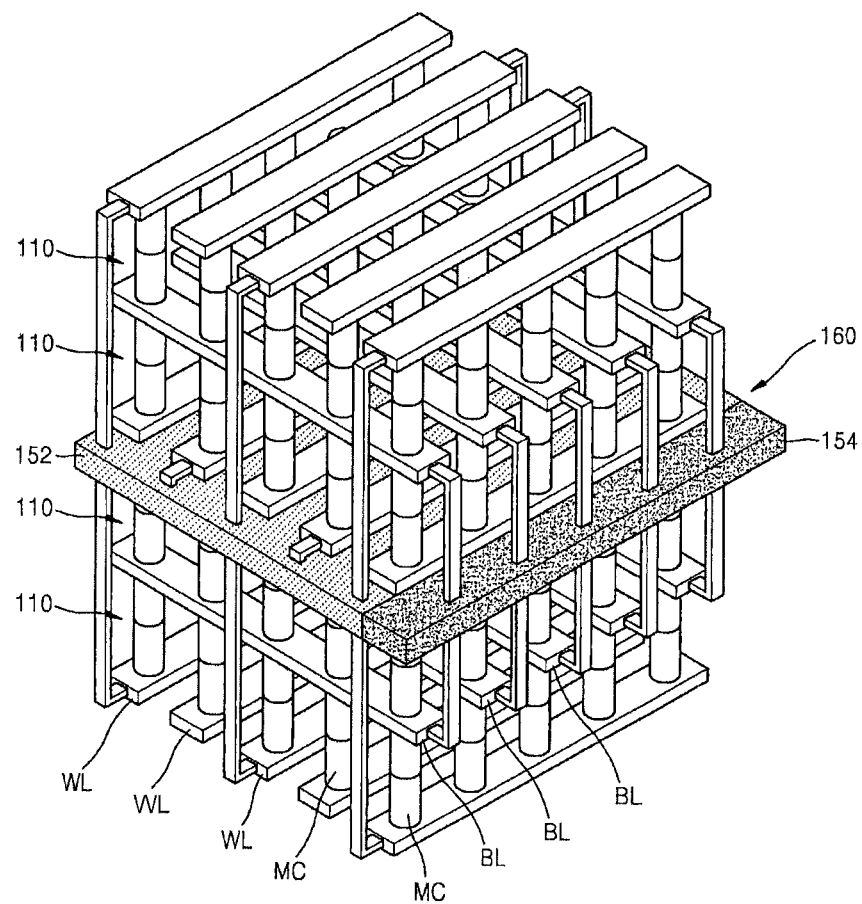
FIG. 3 is a partial perspective view of the stacked memory device of FIG. 2.

FIG. 2 is a schematic view of a stacked memory device according to an example embodiment. FIG. 3 is a partial perspective view of the stacked memory device of FIG. 2. For example, the stacked memory device according to an example embodiment may constitute the memory unit 20 illustrated in FIG. 1.

Referring to FIGS. 2 and 3, a plurality of memory layers 110 may be stacked upon each other. Each memory layer 110 may include an array structure of memory cells MC. Bit lines BL and word lines WL may cross each other. The memory cells MC may be interposed between the bit lines BL and the word lines WL so as to correspond to cross points between the bit lines BL and the word lines WL. However, an example embodiment is not limited to the arrangement of the memory cells MC illustrated in FIG. 3. The memory cells MC may be modified according to a type of memory.

The memory cells MC may be various types of memories, for example, a dynamic random memory (DRAM), a static random access memory (SRAM), a flash memory, a resistive random access memory (RRAM) or a phase change random memory (PRAM). For example, when the memory cell MC is an RRAM, the memory access cells MC may include a variable resistor (not shown) and a switching device (not shown), which are disposed between the bit lines BL and the word lines WL.

Address information for setting a location of storage information may be transmitted through a first active circuit unit 140 and second active circuit units 160 to be converted into a memory selection signal regarding each of the memory cells MC in the memory layer 110. For example, the first active circuit unit 140 may classify and process address information regarding each of the memory cells MC as vertical address information and horizontal address information. The second active circuit units 160 may generate the memory selection signal regarding each of the memory cells MC from the vertical address information and the horizontal address information, which are processed by the first active circuit unit 140.

The first active circuit unit 140 may be shared by the memory layers 110 rather than being formed in the memory layers 110. For example, the first active circuit unit 140 may be disposed at the lowermost portion of the memory layers 110. In order to classify and manage the memory layers as a plurality of groups, the second active circuit units 160 may be interposed between each group of the memory layers 110.

In FIG. 2, four of the memory layers 110 constitute one group so as to be managed by one of the second active circuit units 160, but an example embodiment is not limited thereto. The number of the memory layers 110 constituting one group and the umber of the second active circuit units 160 may be determined according to the number of the memory layers 110.

The first active circuit unit 140 and the second active circuit unit 160 may include a decoder circuit decoding address information. For example, the first active circuit unit 140 may include a level decoder 120 and a pre-decoder 130. The second active circuit unit 160 may include a main decoder 150. Furthermore, the first active circuit unit 140 and the second active circuit unit 160 may include circuits for signal buffering and amplifying.

Figure 4:
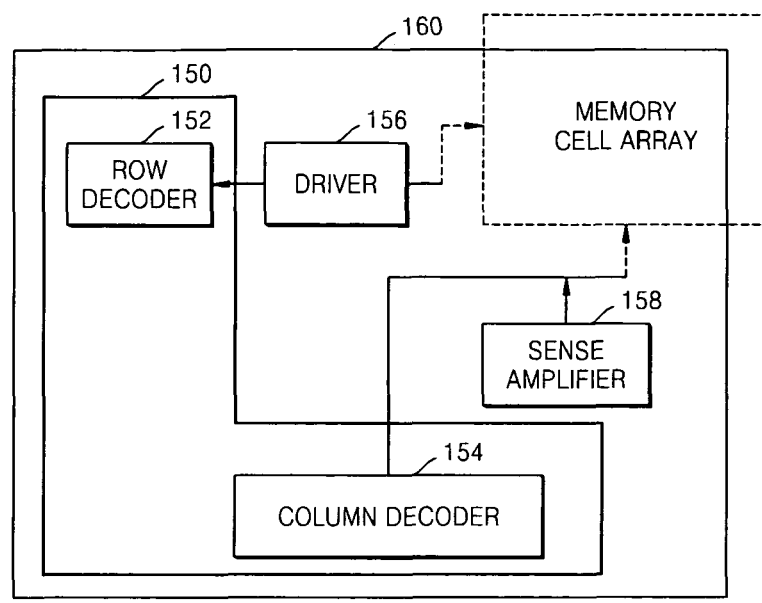
FIG. 4 is block diagram of an example embodiment of a second active circuit illustrated in FIG. 2.

FIG. 4 is block diagram of an example embodiment of the second active circuit 160 illustrated in FIG. 2 For example, as illustrated in FIGS. 3 and 4, the second active circuit unit 160 or main decoder 150 may include a row decoder 152 and/or a column decoder 154. As shown in FIG. 4, the second active circuit 160 further includes a driver 156 and a sense amplifier 158 in addition to the main decoder 150. As further shown in FIG. 4, the row decoder 152 and/or a column decoder 154 may be internal to the main decoder 150. Alternatively, the driver 156 and/or the sense amplifier 158 may be further disposed in the first active circuit unit 140.

In FIG. 2, the level decoder 120 may decode the vertical address information to generate a level selection signal. The level selection signal may include a decoder selection signal for selective access to at least one of the second active circuit units 160 and/or a layer selection signal for selective access to at least one of the memory layers 110 managed by each of the second active circuit units 160. Thus, an appropriate second active circuit unit 160 is selected by the decoder selection signal from among the second active circuit units 160, and then a corresponding memory layer 110 is selected from among the memory layers 110 by the layer selection signal managed by the corresponding second active circuit 160.

Referring to FIG. 2, a pre-decoder 130 may decode the horizontal address information to generate a row/column selection signal for a corresponding memory cell of each of the memory layers 110. The main decoder 150 may combine the level selection signal and the row/column selection signal to generate a memory selection signal for the corresponding memory cell of the memory layers 110. For example, one of the main decoders 150 may select a memory cell from a corresponding memory layer 110 of the group of memory layers 110 managed by the main decoder 150.

Alternatively, the level decoder 120 may generate only the decoder selection signal, and the pre-decoder 130 may generate the layer selection signal in addition to the row/column selection signal. Thus, the pre-decoder 130 may process a portion of the vertical address information in addition to the horizontal address information.

In an example embodiment, the second active circuit units 160, the number of which increases with the number of the memory layers 110, may be stacked between the memory layers 110. Thus, an increase of a bottom area for the second active circuit units 160 may be prevented. In addition, the first active circuit unit 140 is connected to the second active circuit units 160 so as to be shared by the second active circuit units 160, thereby preventing an increase of the size of the second active circuit units 160. Thus, the stacked memory device may have high integration density.

Figure 5:
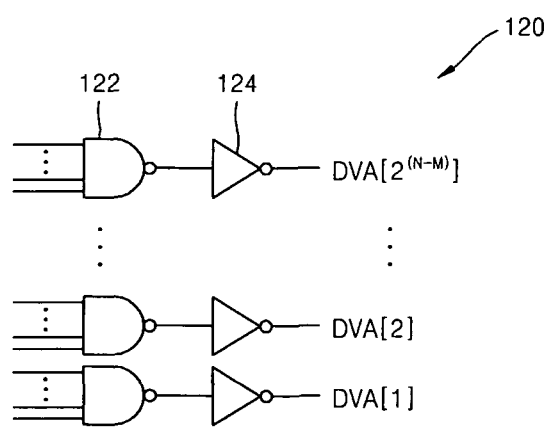
FIG. 5 is a circuit diagram of an example embodiment of a level decoder illustrated in FIG. 2.

FIG. 5 is a circuit diagram of an example embodiment of the level decoder 120 illustrated in FIG. 2.

Referring to FIG. 5, the level decoder 120 may include NAND elements 122 and inverter elements 124. The NAND element 122 and the inverter element 124 may be connected in series so as to form an AND logic unit. The level decoder 120 may decode the horizontal address information to generate level selection signals (DVA[1] ... DVA[$2^{(N-M)}$]).

Figure 6:
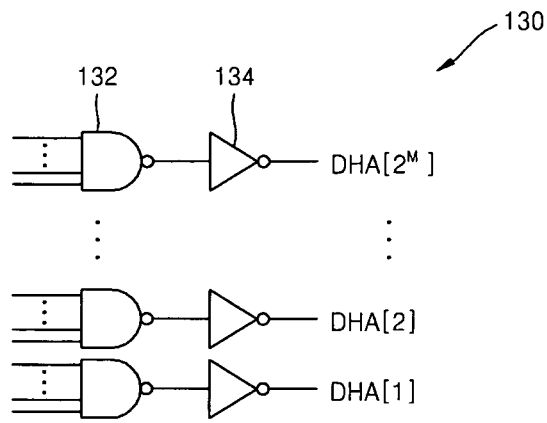
FIG. 6 is a circuit diagram of an example embodiment of a pre-decoder illustrated in FIG. 2.

FIG. 6 is a circuit diagram of an example embodiment of the pre-decoder 130 illustrated in FIG. 2.

Referring to FIG. 6, the pre-decoder 130 may include NAND elements 132 and inverter elements 134. For example, the NAND element 132 and the inverter element 134 may be connected in series to form an AND logic unit. The pre-decoder 130 may decode the horizontal address information to generate row/column signals (DHA[1] ... DHA[2M]).

Figure 7:
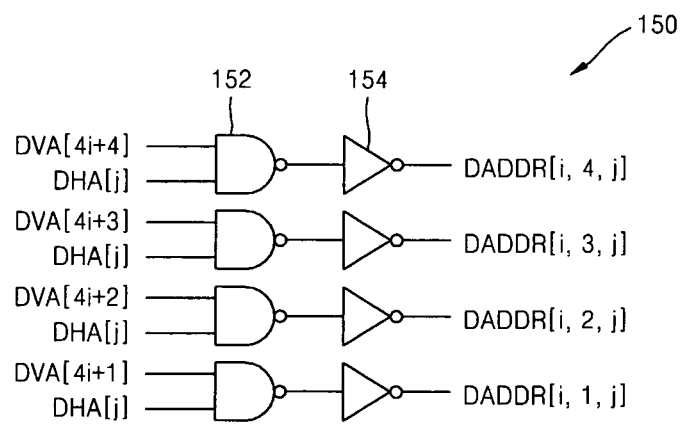
FIG. 7 is a circuit diagram of an example embodiment of a main decoder illustrated in FIG. 2.

FIG. 7 is a circuit diagram of an example embodiment of the main decoder 150 illustrated in FIG. 2.

Referring to FIG. 7, the main decoder 150 may include NAND elements 152 and inverter elements 154. For example, the NAND element 152 and the inverter element 154 may be connected in series to form an AND logic unit. The main decoder 150 may combine and decode level selection signals (DVA[$4j$+1] ... DVA[$4j$+4)]) and a row/column signal (DHA[j]) to generate memory selection signals (DADDR[i, 1, j] ... DADDR[i, 4, j]).

Figure 8:
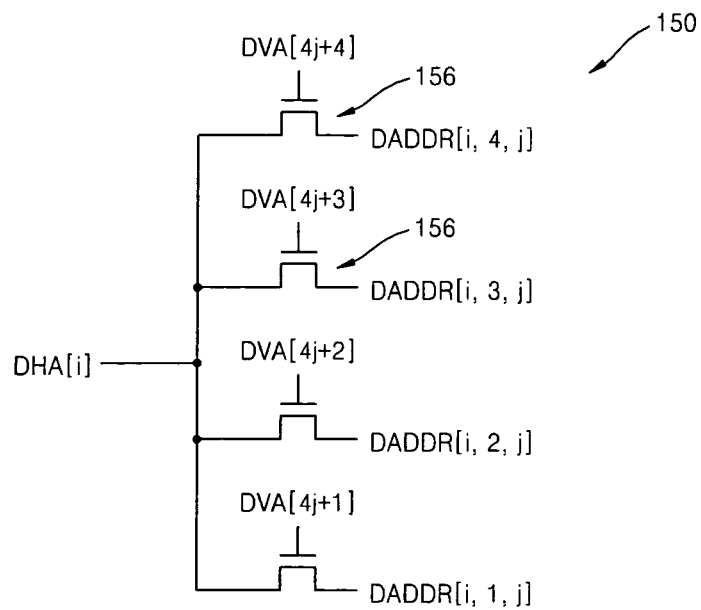
FIG. 8 is a circuit diagram of a main decoder, according to another example embodiment.

FIG. 8 is a circuit diagram of a main decoder 150, according to another example embodiment. The main decoder 150 may include a plurality of transistors 156. The transistors 156 may be of the same type. For example, the transistors 156 may be NMOS transistors. Level selection signals (DVA[$4j$+1] ... DVA[$4j$+4]) may be correspondingly input to a gate of one of the transistors 156. A row/column signal (DHA[i]) may be input to an end, such as a drain, of each of the transistors 156. Thus, when both the level selection signals (DVA[$4j$+1] ... DVA[$4j$+4]) and the row/column signal (DHA[i]) are at a high level, memory selection signals at a high level may be output to at an other end or source of the corresponding transistors 156. Thus, the main decoder 150 can form an AND logic unit by using only the transistors 156.

Figure 9:
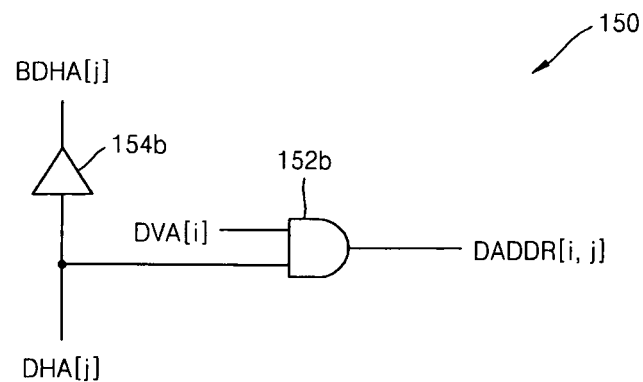
FIG. 9 is a circuit diagram of a main decoder, according to another example embodiment.

FIG. 9 is a circuit diagram of a main decoder 150, according to another example embodiment.

Referring to FIG. 9, the main decoder 150 may include a AND element 152$b$ and an inverter element 154$b$. The main decoder 150 may combine and decode a level selection signal (DVA[i]) and row/column signals (DHA[j], BDHA[j]) to output a memory selection signal (DADDR[i, j]).

Figure 10:
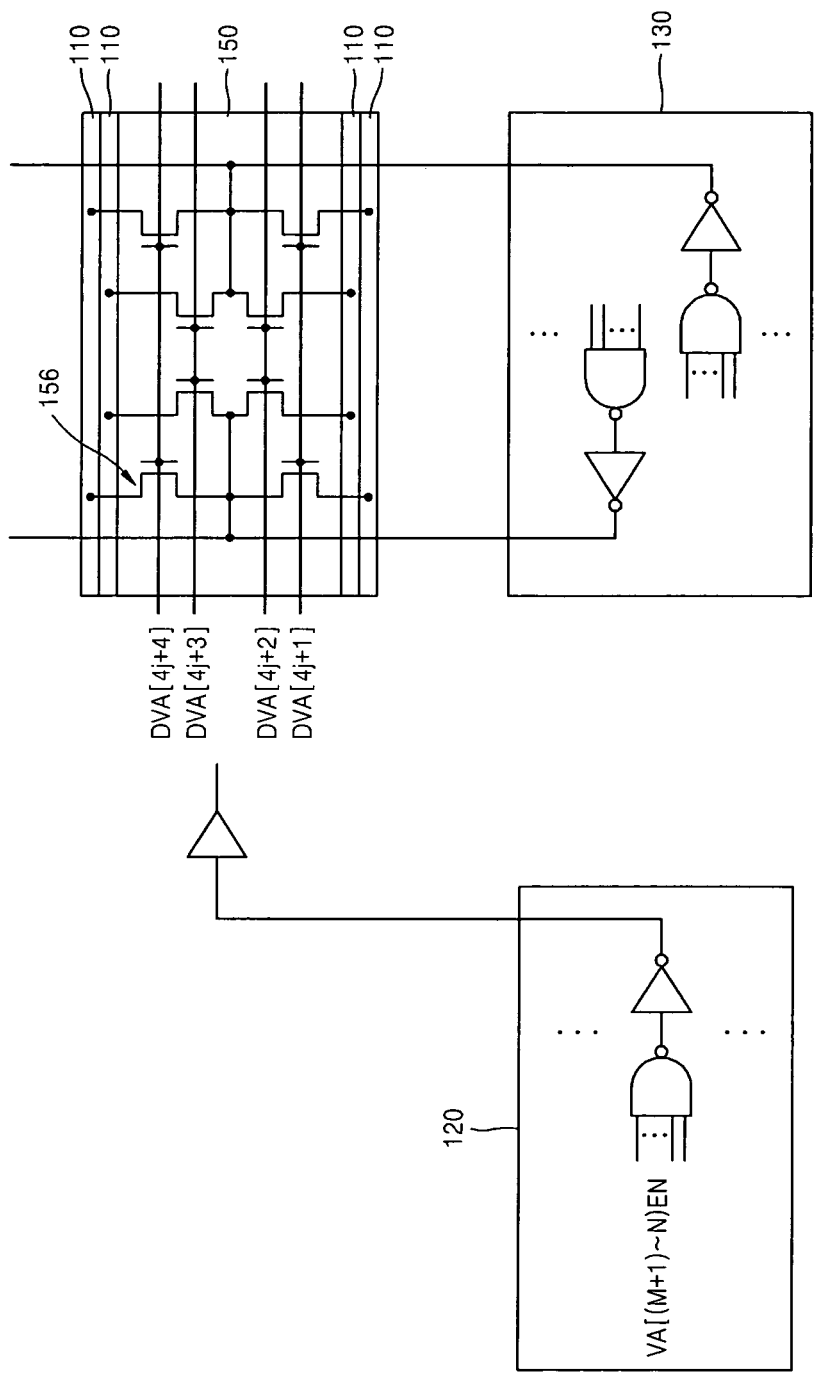
FIG. 10 is a circuit diagram illustrating the case where a stacked memory device transfers a signal, according to an example embodiment.

FIG. 10 is a circuit diagram illustrating the case where a stacked memory device transfers a signal, according to an example embodiment.

Referring to FIG. 10, the main decoder 150 may classify and manage memory layers 110 as odd rows and even rows. Level selection signals (DVA[$4j$+1] ... DVA[$4j$+4]) generated by the level decoder 120 are input to gates of transistors 156 of the main decoder 150. A pre-decoder 130 may be connected to drains of the transistors 156 of the main decoder 150.

Figure 11:
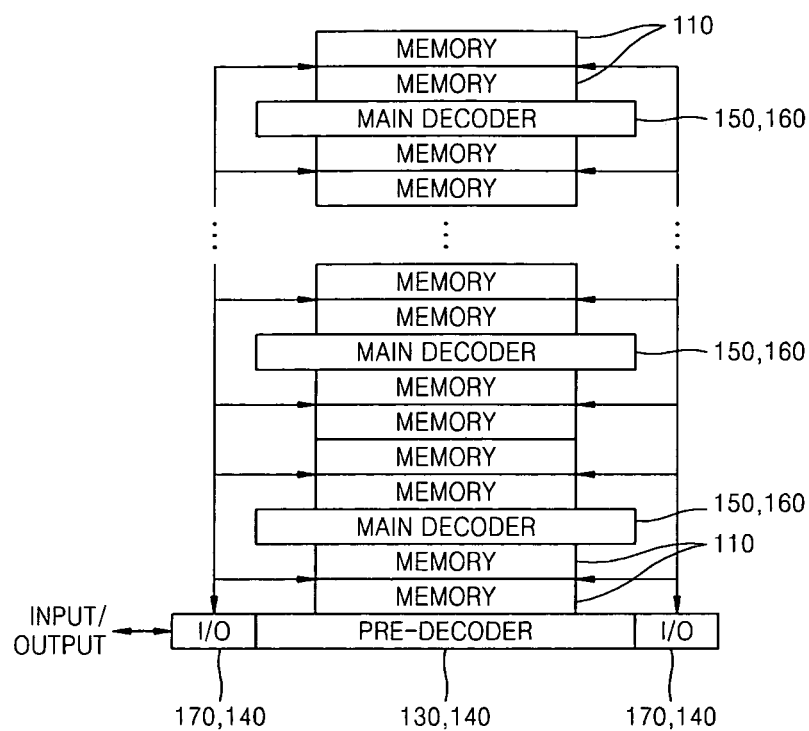
FIG. 11 is a schematic view of an input/output circuit, according to an example embodiment.

FIG. 11 is a schematic view of an input/output circuit 170, according to an example embodiment.

Referring to FIG. 11, the first active circuit unit 140 may further include the input/output circuit 170. For example, the input/output circuit 170 may be disposed next to a pre-decoder 130 opposite to the level decoder 120 (see FIG. 2).

The input/output circuit 170 may be shared by the memory layers 110. For example, as illustrated in FIG. 3, two adjacent memory layers 110 may share bit lines BL. The input/output circuit 170 may be connected to the bit lines BL shared by the two adjacent memory layers 110. Thus, an input/output signal may be transferred through the input/output circuit 170 to the memory layers 110.

Figure 12:
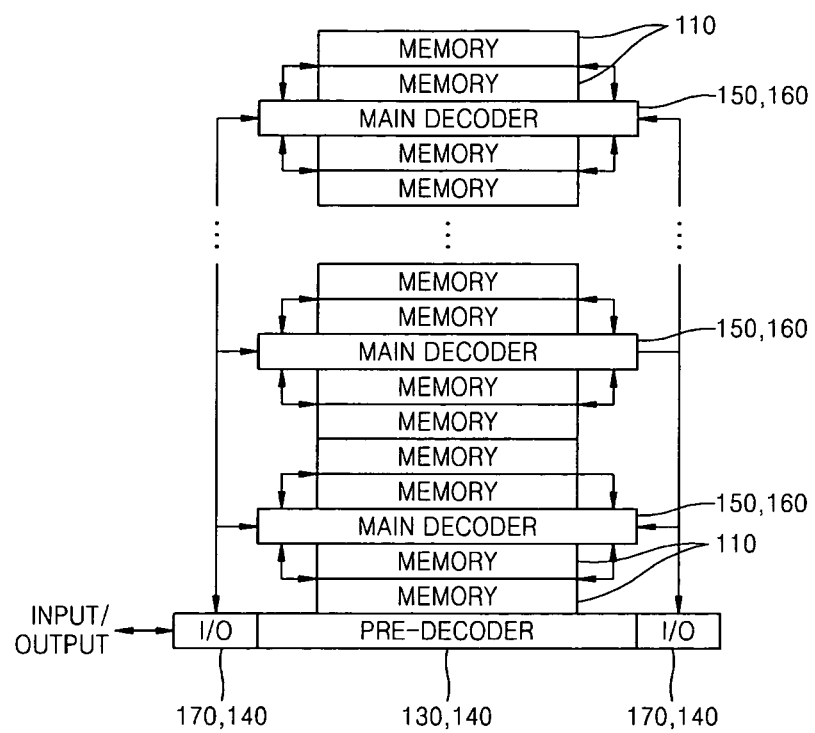
FIG. 12 is a schematic view of an input/output circuit, according to another example embodiment.

FIG. 12 is a schematic view of an input/output circuit 170, according to another example embodiment. Those elements and/or operations of the input/output circuit 170 of FIG. 12 similar to that of the input/output circuit of FIG. 11 will not be repeated below.

Referring to FIG. 12, the input/output circuit 170 may be shared by main decoders 150 of second active circuit units 160. The main decoder 150 may be connected to corresponding memory layers 110 managed by the main decoder 150. Thus, an input/output signal may be transferred through the input/output circuit 170 to the main decoders 150, and then may be transferred to the memory layers 110. At this time, the input/output signal may be simultaneously connected to the corresponding memory layers 110 through the main decoder 150, or alternatively may be connected to the memory layer 110 selected from among the memory layers 110.

According to an example embodiment, the input/output signal can be transferred only to a selected memory layer 110 through a selected main decoder 150, thereby reducing loss in an input/output signal. Thus, even if an input/output signal is weak, the input/output signal may be transferred without a substantial loss.

Figure 13:
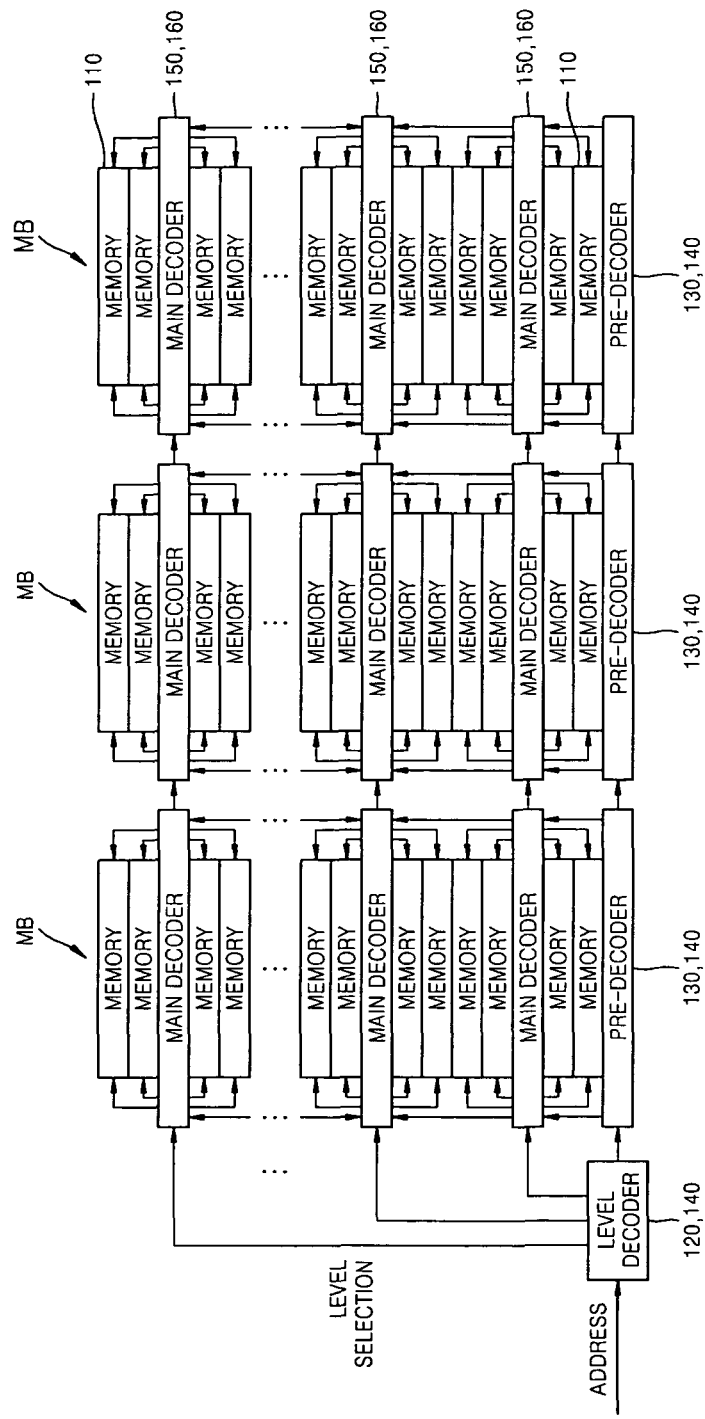
FIG. 13 is a schematic view of a stacked memory device according to another example embodiment.

FIG. 13 is a schematic view of a stacked memory device according to another example embodiment.

Referring to FIG. 13, a plurality of memory blocks MB may be arranged in an array shape. Each of the memory blocks MB may correspond to the stacked memory device of FIG. 2. A level decoder 120 may be shared by the memory blocks MB. Pre-decoders 130 may be disposed at the lowermost portion of the memory layers 110 of the memory blocks MB. Main decoders 150 of a memory block MB may be arranged at the same level with other main decoders 150 of another memory block MB.

Figure 14:
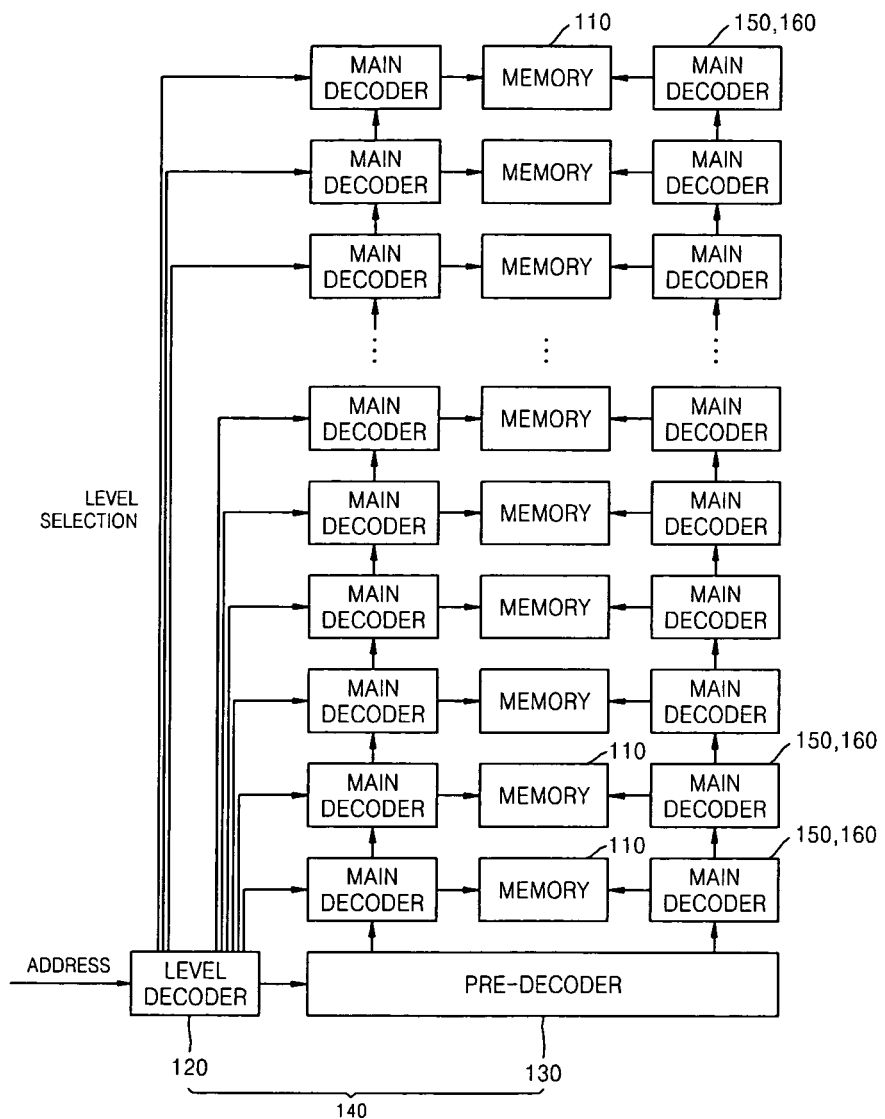
FIG. 14 is a schematic view of a stacked memory device according to another example embodiment.

FIG. 14 is a schematic view of a stacked memory device according to another example embodiment. Those elements and/or operations of the stacked memory device of FIG. 14 similar to that described in FIGS. 2 through 12 will not be repeated below.

Referring to FIG. 14, second active circuit units 160 may be disposed at the same level of the memory layers 110. For example, the second active circuit unit 160 may include a pair of main decoders 150 disposed at both sides of the memory layer 110 that is disposed at the same level of the second active circuit units 160.

In an example embodiment, since the main decoders 150 are disposed at the same level of the memory layers 110, the memory layer 110 disposed at the same level of the main decoder 150 selects the main decoder 150. Thus, a level selection signal may include only a decoder selection signal without a layer selection signal.

Figure 15:
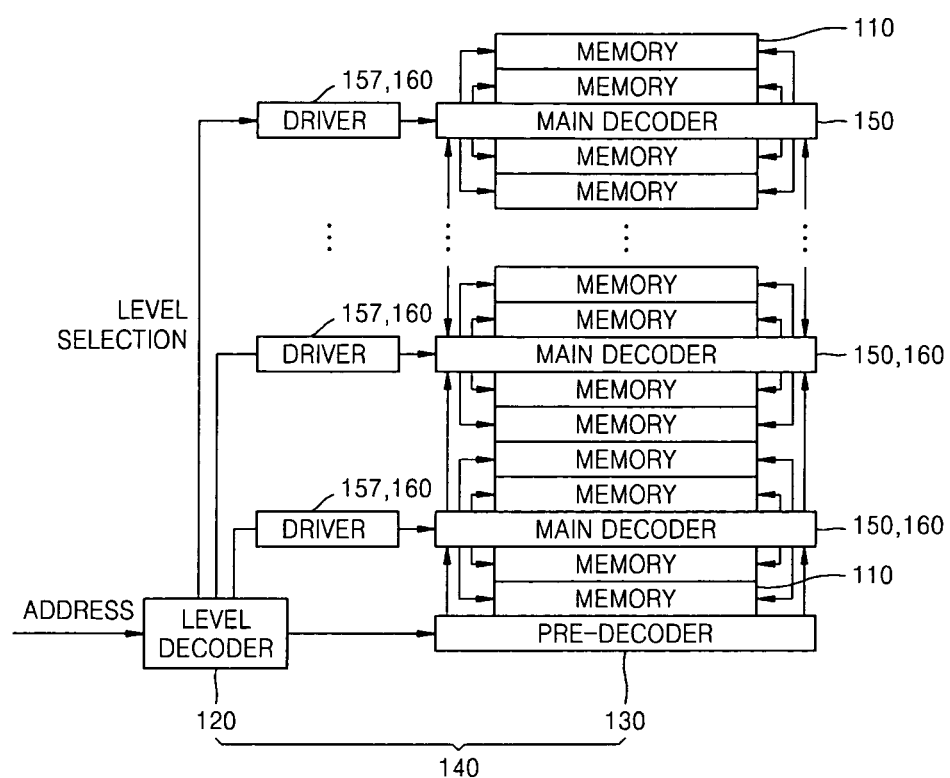
FIG. 15 is a schematic view of a stacked memory device according to another example embodiment.

FIG. 15 is a schematic view of a stacked memory device according to another example embodiment. Those elements and/or operations of the stacked memory device of FIG. 15 similar to that described in FIGS. 2 through 12 will not be repeated below.

Referring to FIG. 15, each of second active circuit units 160 may include a main decoder 150 and a driver 157. The drivers 157 may be interposed between a level decoder 120 and main decoders 150. The drivers 157 may also be disposed at the same level with the main decoders 150.

The drivers 157 may buffer a level selection signal generated by the level decoder 120. Since a number of the drivers 157 may be the same as that of the main decoders 150, the capacity of the driver 157 may be appropriately controlled. However, if all of the drivers 157 are disposed in the level decoder 120, the size of the level decoder 120 may increase. Thus, according to an example embodiment, the level selection signal can be effectively buffered without increasing the size of the level decoder 120.

Figure 16:
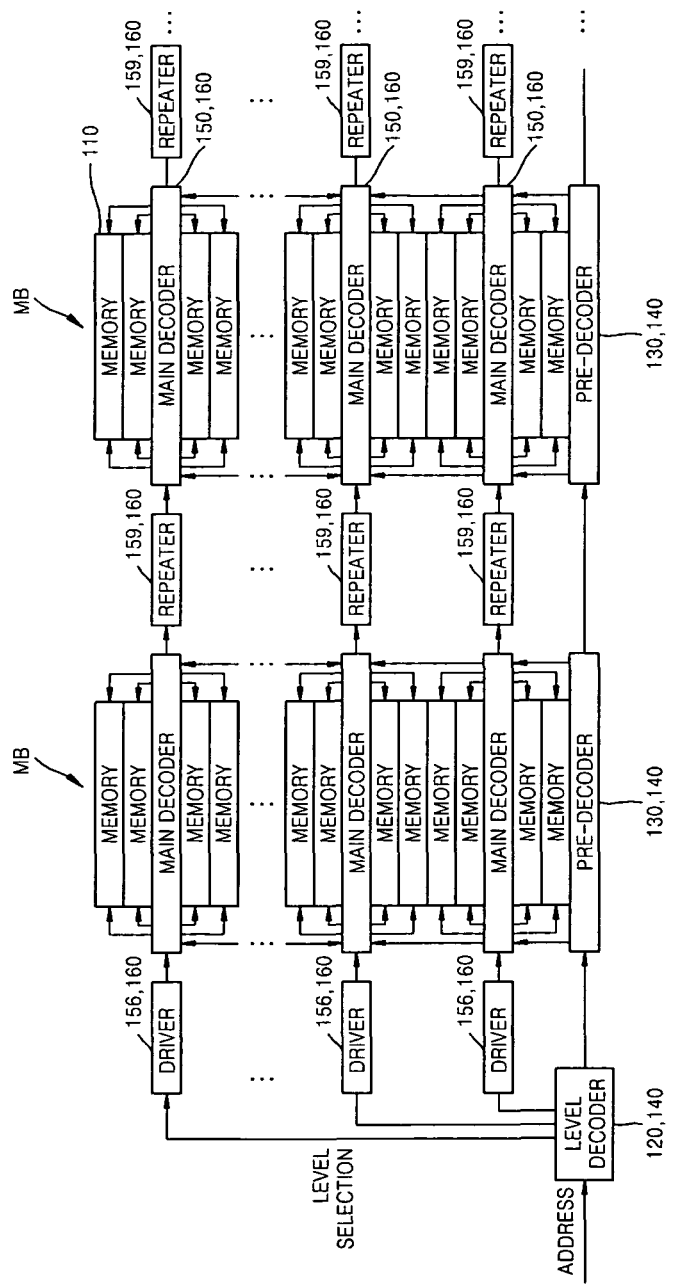
FIG. 16 is a schematic view of a stacked memory device according to another example embodiment.

FIG. 16 is a schematic view of a stacked memory device according to another example embodiment. Those elements and/or operations of the stacked memory device of FIG. 16 similar to that described in FIG. 15 will not be repeated below.

Referring to FIG. 16, memory blocks MB may be arranged in an array shape. Each of the memory blocks MB may correspond to the stacked memory device of FIG. 15. However, repeaters 159 instead of the drivers 157 (see FIG. 15) may be disposed between the memory blocks MB.

Figure 17:
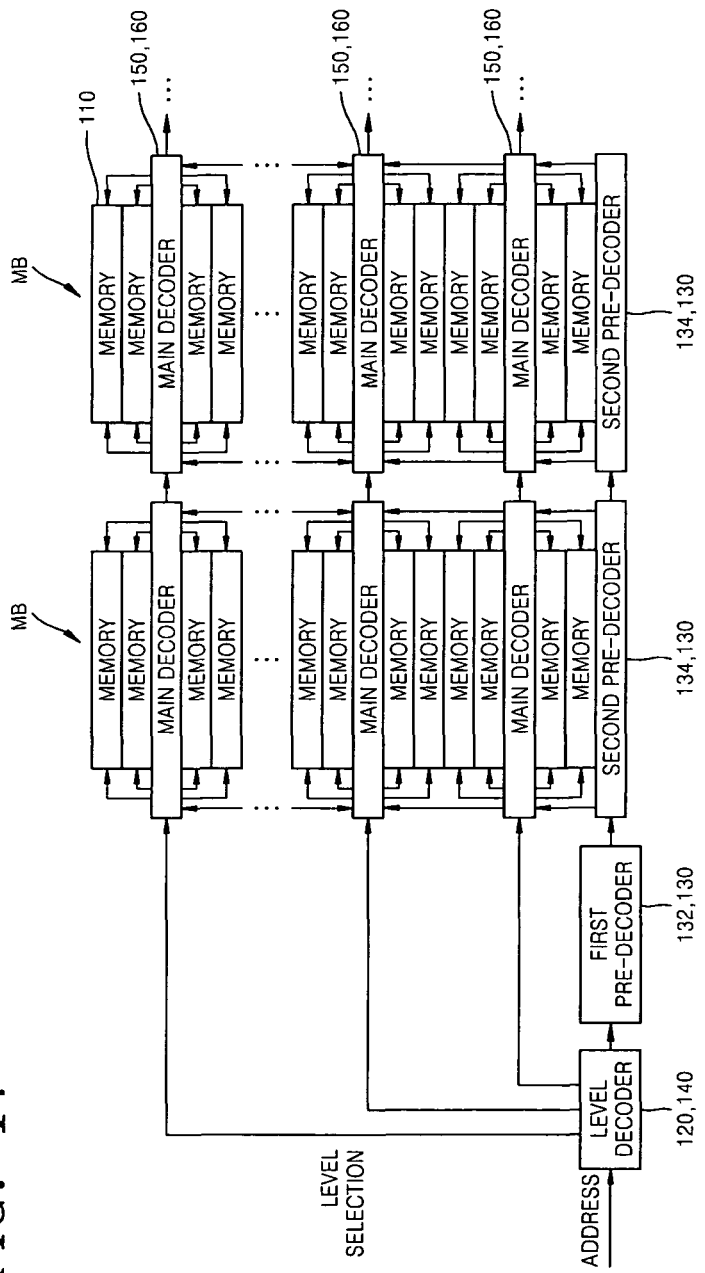
FIG. 17 is a schematic view of a stacked memory device according to another example embodiment.

FIG. 17 is a schematic view of a stacked memory device according to another example embodiment. Those elements and/or operations of the stacked memory device of FIG. 16 similar to that described in FIG. 13 will not be repeated below.

Referring to FIG. 17, a pre-decoder 130 may include a first pre-decoder 132 and a second pre-decoder 134. The second pre-decoder 134 may be disposed at the lowermost portion of memory block MB. The first pre-decoder 132 may be shared by the second pre-decoders 134. Thus, information common to the memory blocks MB, which is selected from among horizontal address information, is decoded by the first pre-decoder 132, and the remaining information may be decoded by the second pre-decoders 134.

In an example embodiment, the capacity of the second pre-decoder 134 disposed at each memory block MB can be reduced, thereby preventing the size of the memory block MB from increasing due to the size of the second pre-decoder 134.

It should be understood that the example embodiments described therein should be considered in a descriptive sense only and not for purposes of limitation. Descriptions of features or aspects within each example embodiment should typically be considered as available for other similar features or aspects in other example embodiments.

What is claimed is:

1. A stacked memory device comprising:
    a plurality of memory layers, where at least one of the plurality of memory layers is stacked on another of the plurality of memory layers and each of the memory layers includes an array of memory cells;
    a first active circuit unit configured to classify and process address information for at least one of the memory cells as vertical address information and horizontal address information; and
    at least one second active circuit unit configured to generate a memory selection signal for at least one of the memory cells based on signals processed by the first active circuit unit, wherein the at least one second active circuit unit includes a plurality of main decoders, each of the at least one second active circuit interposed between at least two of the memory layers, and wherein the first active circuit unit, the at least one second active circuit unit, and the memory layers are in separate layers from each other.

2. The stacked memory device of claim 1, wherein the first active circuit unit comprises:
    a level decoder configured to decode the vertical address information; and
    a pre-decoder configured to decode the horizontal address information.

3. The stacked memory device of claim 2, wherein the pre-decoder comprises:
    a first pre-decoder; and
    a second pre-decoder.

4. The stacked memory device of claim 1, wherein the first active circuit unit is in a bottom plane and the at least one second active circuit unit is in a plane above the bottom plane.

5. The stacked memory device of claim 1, wherein the first active circuit unit comprises:
    a level decoder generating a level selection signal; and
    a pre-decoder generating a row/column signal.

6. The stacked memory device of claim 5, wherein,
    the level selection signal is generated by decoding the vertical address information, and
    the row/column signal is generated by decoding the horizontal address information.

7. The stacked memory device of claim 5, wherein the level selection signal includes,
    a decoder selection signal for selective access to at least one of the plurality of main decoders, and
    a layer selection signal for selective access to at least one of the memory layers managed by at least one of the plurality of main decoders.

8. The stacked memory device of claim 1, wherein the at least one second active circuit unit comprises:
    a plurality of main decoders disposed at a same level with the plurality of memory layers.

9. The stacked memory device of claim 1, wherein the at least one second active circuit unit comprises:
    a main decoder decoding signals processed by the first active circuit unit.

10. The stacked memory device of claim 9, wherein the main decoder comprises:
    a row decoder; and
    a column decoder.

11. The stacked memory device of claim 9, wherein the at least one second active circuit unit further comprises:
    a sense amplifier configured to amplify information read from the memory cell array.

12. The stacked memory device of claim 9, wherein the at least one second active circuit unit further comprises:
    a driver configured to buffer a signal generated by the first active circuit unit and received by the main decoder.

13. The stacked memory device of claim 9, wherein the main decoder comprises:
    a plurality of transistors, where each of the transistors is of a same type.

14. The stacked memory device of claim 13, wherein,
    the vertical address information processed by the first active circuit unit is input to gates of the plurality of transistors, and the horizontal address information processed by the first active circuit unit is input to drains of the plurality of transistors.

15. The stacked memory device of claim 1, wherein the first active circuit unit further comprises:
an input/output circuit configured to process a data signal of the plurality of memory layers, where the input/output circuit is shared by the plurality of the memory layers.

16. The stacked memory device of claim 1, wherein the first active circuit unit further comprises:
an input/output circuit configured to process a data signal of the plurality of memory layers, where the input/output circuit is shared by the at least one second active circuit unit.

17. The stacked memory device of claim 1, wherein the memory cell includes a resistive random access memory (RRAM) device.

18. A stacked memory device comprising:
a plurality of memory layers, where at least one of the plurality of memory layers is stacked on another of the plurality of memory layers and each of the memory layers includes an array of memory cells;
a first active circuit unit including a level decoder and a pre-decoder, where the level decoder is configured to decode vertical address information of at least one of the memory cells to generate a level selection signal, and the pre-decoder is configured to decode horizontal address information of at least one of the memory cells to generate a row/column signal; and
a plurality of second active circuit units stacked on the first active circuit unit in order to classify and manage the plurality of memory layers according to a plurality of groups of memory layers, wherein
each of the second active circuit units includes a main decoder configured to decode the level selection signal and the row/column selection signal to generate a memory selection signal.

19. The stacked memory device of claim 18, wherein each of the second active circuit units are interposed between at least two of the memory layers.

20. A method of accessing a stacked memory device, comprising:
providing a plurality of memory layers, where at least one of the plurality of memory layers is stacked on another of the plurality of memory layers and each of the memory layers includes an array of memory cells;
classifying and processing address information at a first active circuit unit for at least one of the memory cells as vertical address information and horizontal address information; and
generating a memory selection signal from at least one second active circuit unit for at least one of the memory cells based on signals processed by the classifying and processing, wherein the at least one second active circuit unit includes a plurality of main decoders, each of the at least one second active circuit interposed between at least two of the memory layers, and wherein the first active circuit unit, the at least one second active circuit unit, and the memory layers are in separate layers from each other.

21. The method claim 20, further comprising:
generating a level selection signal and a row/column signal at the first active circuit, where the level selection signal is generated by decoding the vertical address information, and the row/column signal is generated by decoding the horizontal address information.

22. The method of claim 21, wherein the level selection signal includes,
a decoder selection signal for selective access to the at least one second active circuit, and
a layer selection signal for selective access to at least one of the memory layers managed by the at least one of second active circuit unit.

23. The method of claim 20, further comprising:
buffering a signal generated by the first active circuit unit and received by the at least one second active circuit.

* * * * *